(12) United States Patent
Huang et al.

(10) Patent No.: US 12,008,182 B2
(45) Date of Patent: *Jun. 11, 2024

(54) FLEXIBLE DEVICE

(71) Applicant: Innolux Corporation, MiaoLi County (TW)

(72) Inventors: Yu-Chia Huang, Miao-Li County (TW); Yuan-Lin Wu, Miao-Li County (TW); Kuan-Feng Lee, Miao-Li County (TW); Tsung-Han Tsai, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/955,489

(22) Filed: Sep. 28, 2022

(65) Prior Publication Data
US 2023/0021494 A1  Jan. 26, 2023

Related U.S. Application Data

(63) Continuation of application No. 17/024,723, filed on Sep. 18, 2020, now Pat. No. 11,487,372.

(30) Foreign Application Priority Data

Oct. 11, 2019 (CN) .......................... 201910964704.3

(51) Int. Cl.
*G06F 3/041* (2006.01)
*G02F 1/1333* (2006.01)
(Continued)

(52) U.S. Cl.
CPC ...... *G06F 3/0412* (2013.01); *G02F 1/133305* (2013.01); *G02F 1/13338* (2013.01);
(Continued)

(58) Field of Classification Search
CPC ........... B29C 2045/14147; B29C 2045/14163; B29C 2045/14532; B29C 2045/1454; B29C 45/14; B29C 45/14016; B29C 45/14467; B29C 70/72; B29K 2995/0007; B29L 2031/34; B32B 1/00; B32B 2250/24; B32B 2255/10; B32B 2255/20; B32B 2255/205; B32B 2255/26; B32B 2307/202; B32B 2307/206; B32B 2307/4023; B32B 2457/00; B32B 2457/20; B32B 27/08; B32B 27/281; B32B 27/302; B32B 27/308; B32B 27/36; B32B 27/365; B32B 3/08; B32B 3/266; B32B 3/30; B32B 7/12; G02F 1/133305; G02F 1/133345; G02F 1/13338;
(Continued)

(56) References Cited

U.S. PATENT DOCUMENTS

2018/0108868 A1* 4/2018 Kuo ...................... H10K 77/111
2019/0278402 A1* 9/2019 Ishizaki .............. G06F 3/04166
(Continued)

*Primary Examiner* — Insa Sadio
(74) *Attorney, Agent, or Firm* — JCIPRNET

(57) ABSTRACT

The disclosure provides a flexible device. The flexible display device includes a flexible substrate and a planarized layer. A thickness of the planarized layer is in a range from 0.5 μm to 200 μm. A thickness ratio of the thickness of the planarized layer to a thickness of the flexible substrate is in a range from 0.025 to 20.

7 Claims, 8 Drawing Sheets

(51) Int. Cl.
*G02F 1/1335* (2006.01)
*G02F 1/1341* (2006.01)
*H01L 25/16* (2023.01)
*G02F 1/1339* (2006.01)

(52) U.S. Cl.
CPC ...... *G02F 1/133514* (2013.01); *G02F 1/1341* (2013.01); *H01L 25/167* (2013.01); *G02F 1/1339* (2013.01); *G06F 2203/04102* (2013.01)

(58) Field of Classification Search
CPC ......... G02F 1/133512; G02F 1/133514; G02F 1/1339; G02F 1/134336; G02F 1/136286; G02F 1/1368; G02F 2201/123; G02F 2201/52; G02F 2202/28; G06F 2203/04107; G06F 2203/04108; G06F 2203/04111; G06F 2203/04112; G06F 3/0412; G06F 3/04166; G06F 3/0445; G06F 3/0446; H05K 1/028; H05K 1/0284; H05K 1/115; H05K 1/189; H05K 2201/09209; H05K 2203/1327; H05K 3/0014; H05K 3/32
See application file for complete search history.

(56) References Cited

U.S. PATENT DOCUMENTS

2019/0296089 A1* 9/2019 Isa ..................... H05B 33/26
2021/0109618 A1* 4/2021 Huang ................ G02F 1/1341

* cited by examiner

FLEXIBLE DEVICE

CROSS-REFERENCE TO RELATED APPLICATION

This application is a continuation of and claims the benefit of a prior U.S. application Ser. No. 17/024,723, filed Sep. 18, 2020, now allowed. The prior U.S. application Ser. No. 17/024,723 claims the priority benefit of China application serial no. 201910964704.3, filed on Oct. 11, 2019. The entirety of each of the above-mentioned patent applications is hereby incorporated by reference herein and made a part of this specification.

BACKGROUND

Technical Field

The disclosure relates to a flexible device.

Description of Related Art

With the advancement of modern video technologies, various technologies for displaying have been introduced into display devices on the market. A flexible display device has the advantages of a small volume, being foldable, or the like, so that the flexible display device is one of the technologies that have been vigorously developed in recent years.

SUMMARY

The disclosure is directed to a flexible device. The flexible display device has the advantages of small thickness or low manufacturing cost and the like.

According to an embodiment of the disclosure, the flexible device includes a flexible substrate, a planarized layer. A thickness of the planarized layer is in a range from 0.5 μm to 200 μm. A thickness ratio of the thickness of the planarized layer to a thickness of the flexible substrate is in a range from 0.025 to 20.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
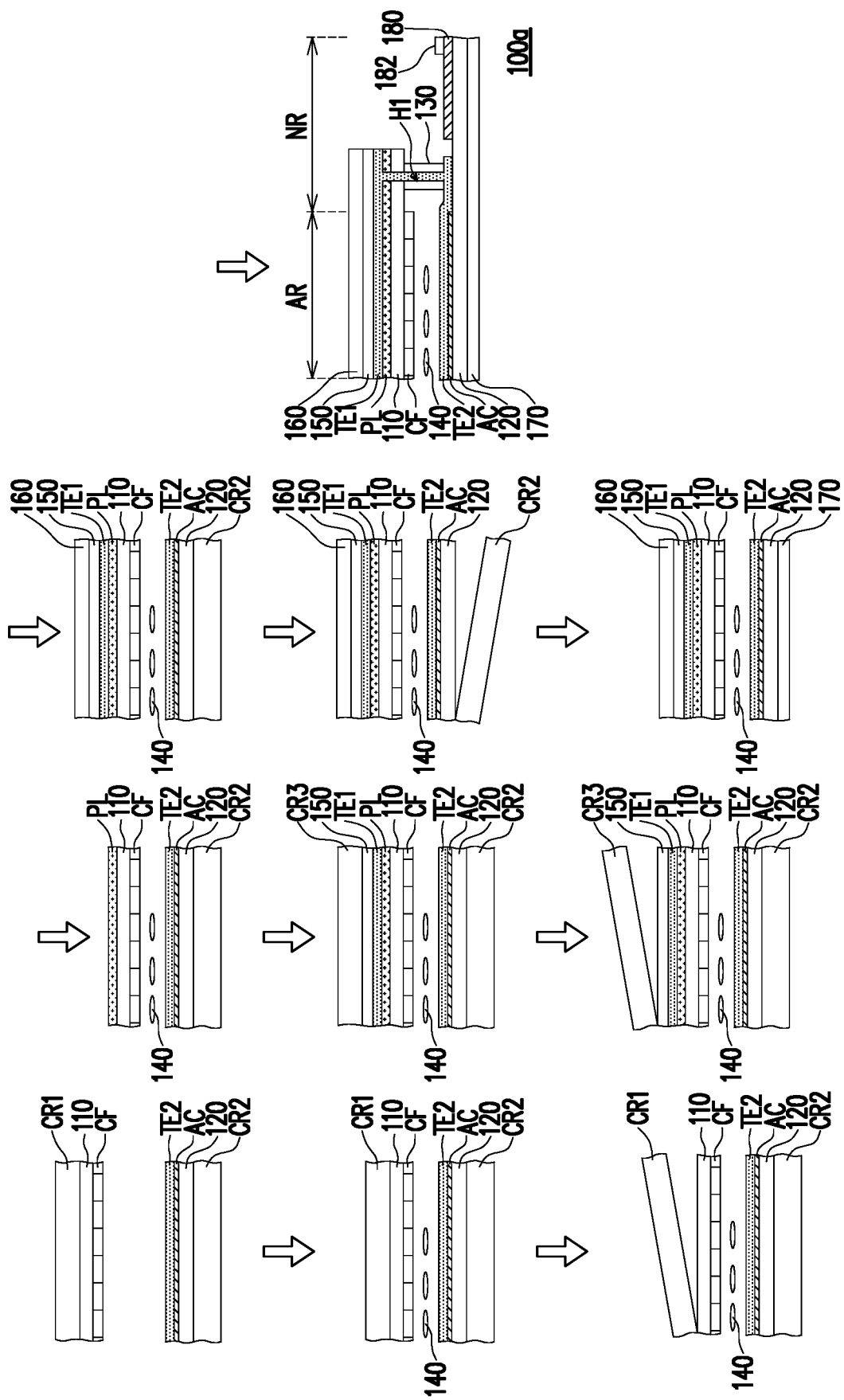
FIG. 1 is a schematic diagram of a partial manufacturing process of a flexible display device according to an embodiment of the disclosure.

A structure (or layer, component, substrate) being located on another structure (or layer, component, substrate) described in the disclosure may mean that two structures are adjacent and directly connected, or may mean that two structures are adjacent and indirectly connected. Indirect connection means that there is at least one intermediate structure (or intermediate layer, intermediate component, intermediate substrate, intermediate spacing) between two structures, the lower surface of a structure is adjacent or directly connected to the upper surface of the intermediate structure, and the upper surface of the other structure is adjacent or directly connected to the lower surface of the intermediate structure. The intermediate structure may be a single-layer or multi-layer physical structure or non-physical structure, which is not limited. In the disclosure, when a structure is disposed "on" another structure, it may mean that a structure is "directly" disposed on another structure, or a structure is "indirectly" disposed on another structure, that is, at least one structure is sandwiched between a structure and another structure.

The electrical connection or coupling described in the disclosure may refer to direct connection or indirect connection. In the case of a direct connection, terminals of two components on a circuit are directly connected or interconnected by a conductor segment. In the case of an indirect connection, there are switches, diodes, capacitors, inductors, other suitable components, or a combination of the above components between terminals of two components on a circuit, but are not limited thereto.

In the disclosure, the thickness, length and width may be measured by an optical microscope, and the thickness may be measured by a cross-sectional image in an electron microscope, but is not limited thereto. In addition, there may be some error between any two values or directions used for comparison. If a first value is equal to a second value, it implies that there may be an error of approximately 10% between the first value and the second value; if a first direction is perpendicular to a second direction, it implies that an angle between the first direction and the second direction may range from 80 to 100 degrees; and if a first direction is parallel to a second direction, it implies that an angle between the first direction and the second direction may range from 0 to 10 degrees.

Exemplary embodiments of the disclosure are described in detail, and examples of the exemplary embodiments are shown in the accompanying drawings. Whenever possible, the same component symbols are used in the drawings and descriptions to indicate the same or similar parts.

Figure 2:
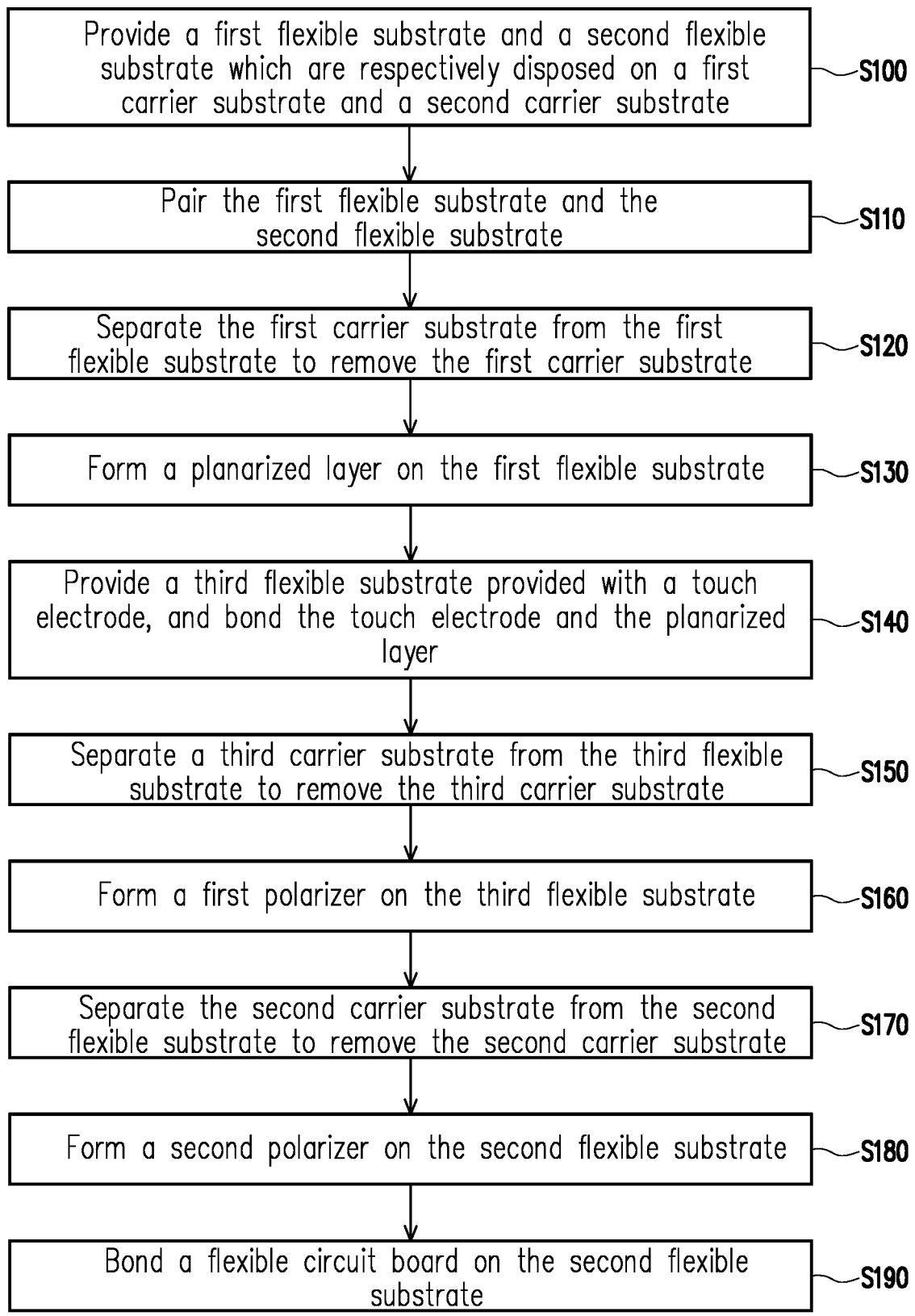
FIG. 2 is a flowchart of a manufacturing method of a flexible display device according to an embodiment of the disclosure.

FIG. 1 is a schematic diagram of a partial manufacturing process of a flexible display device according to an embodiment of the disclosure, and FIG. 2 is a flowchart of a manufacturing method of a flexible display device according to an embodiment of the disclosure.

Referring to FIG. 1 and FIG. 2 at the same time, in Step S100 of the present embodiment, a first flexible substrate 110 and a second flexible substrate 120 which are respectively disposed on a first carrier substrate CR1 and a second carrier substrate CR2 are provided. In the present embodiment, a light conversion structure CF is disposed on the first flexible substrate 110, and a touch electrode TE2 is disposed on the second flexible substrate 120. In some embodiments, the first carrier substrate CR1 and the second carrier substrate CR2 may be hard substrates which are difficult to deform by an external force in the manufacturing process, so that the first flexible substrate 110 and the second flexible substrate 120 which are respectively disposed on the first carrier substrate CR1 and the second carrier substrate CR2 may have better flatness, and film layers subsequently disposed on the first flexible substrate 110 and the second flexible substrate 120, respectively, may have better stability. A material of the first carrier substrate CR1 and the second carrier substrate CR2 may include, for example, glass, polycarbonate, stainless steel, or a combination thereof. A material of the first flexible substrate 110 and the second flexible substrate 120 may include, for example, polyimide (PI), polyethylene naphthalate (PEN), polyethylene terephthalate (PET) or a combination of at least two of the foregoing materials. In the present embodiment, the material of the first flexible substrate 110 and the second flexible substrate 120 includes PI. A method of respectively forming the first flexible substrate 110 and the second flexible substrate 120 on the first carrier substrate CR1 and the second carrier substrate CR2 may be, for example, a slit coating method, a spin coating method, or a combination of the slit coating method and the spin coating method. The light conversion structure CF may include, for example, at least three light conversion patterns that may convert different colors, respectively. For example, the at least three light conversion patterns may convert different colors, respectively, such as three primary colors (i.e., red, green and blue), but the disclosure is not limited thereto. For example, the light conversion structure CF may further include a fourth color filter pattern, a fifth color filter pattern, or more color filter patterns. A method of forming the touch electrode TE2 may be, for example, a sputtering method, but the disclosure is not limited thereto. A material of the touch electrode TE2 may include a metal oxide conductive material (such as indium tin oxide, indium zinc oxide, aluminum tin oxide, aluminum zinc oxide and indium antimony zinc oxide), other suitable transparent conductive materials, or a stacked layer of at least two of the above materials. In the present embodiment, the touch electrode TE2 is a transparent conductive material layer. In addition, an element layer AC and an insulating layer (not shown) are also disposed between the second flexible substrate 120 and the touch electrode TE2, and the insulating layer is, for example, disposed between the touch electrode TE2 and the element layer AC. The element layer AC may be, for example, electrically connected to the touch electrode TE2 through a through hole running through the insulating layer. In some embodiments, the element layer AC may be any active element layer known to those skilled in the art. For example, the element layer AC may include a plurality of scan lines, a plurality of data lines, a plurality of transistors and a plurality of electrodes. In some embodiments, the element layer AC may include a plurality of lines without including transistors. A material of the insulating layer may include an inorganic material, an organic material or a combination of the inorganic material and the organic material, and has better flatness. Through the arrangement of the foregoing insulating layer, the touch electrode TE2 may be arranged steadily without an uneven surface. Therefore, the touch electrode TE2 may have a stable electrical property.

In Step S110, the first flexible substrate 110 and the second flexible substrate 120 are paired. The pairing of the first flexible substrate 110 and the second flexible substrate 120 may include, for example, the following steps.

Firstly, a sealant 130 may be disposed on the first flexible substrate 110 or the second flexible substrate 120. The sealant 130 is, for example, disposed in a non-display region NR of the flexible display device of the present embodiment. The non-display region NR may be located on at least one side of a display region AR. For example, the non-display region NR may surround the display region AR, but the disclosure is not limited thereto. In some embodiments, the sealant 130 may include a plurality of sealant spacers (not shown). For example, the sealant 130 is, for example, conductive particles having a particular size or a spacer having a particular shape, but the disclosure is not limited thereto. The sealant 130 may be, for example, formed by being exposed to ultraviolet light (UV light) or formed by heating and solidification, and may be configured to bond the first flexible substrate 110 or the second flexible substrate 120, but the disclosure is not limited thereto. In the present embodiment, the sealant 130, the first flexible substrate 110 and the second flexible substrate 120 may form an accommodating space.

Further, the accommodating space formed by the sealant 130, the first flexible substrate 110 and the second flexible substrate 120 is disposed in a display medium layer 140. From another point of view, the display medium layer 140 is disposed in the display region AR of the flexible display device of the present embodiment. The display medium layer 140 may include a non-self-luminous material, such as a liquid crystal molecule, an electrophoretic display medium, or other suitable media, but the disclosure is not limited thereto. In some other embodiments, the display medium layer 140 may include a self-luminous material, such as an organic light emitting diode (OLED), an inorganic light emitting diode (LED) including a mini LED or a micro LED, a quantum dot (QD), a quantum dot light emitting diode (QLED or QDLED), fluorescence, phosphor, other suitable materials or a combination of the above materials, but is not limited to thereto. In the present embodiment, the display medium layer 140 is a liquid crystal molecule. The liquid crystal molecule is a liquid crystal molecule that may be rotated or switched by a vertical electric field or a liquid crystal molecule that may be rotated or switched by a transverse electric field, but the disclosure is not limited thereto. After the first flexible substrate 110 and the second flexible substrate 120 are paired, the light conversion structure CF on the first flexible substrate 110 may be disposed opposite to the touch electrode TE2 on the second flexible substrate 120. In addition, at least one of the first carrier substrate CR1 and the second carrier substrate CR2 is removed in the subsequent step.

In Step S120, the first carrier substrate CR1 and the first flexible substrate 110 are separated to remove the first carrier substrate CR1. A method of separating the first carrier substrate CR1 from the first flexible substrate 110 may be achieved, for example, by performing a laser stripping process or a mechanical stripping process. In the present embodiment, the laser stripping process is performed to separate the first carrier substrate CR1 from the first flexible substrate 110, but the disclosure is not limited thereto. The objective of removing the first carrier substrate CR1 is to subsequently form a film layer on an exposed surface of the first flexible substrate 110, so that the time of removing the first carrier substrate CR1 is, for example, as described below. In one embodiment, the first carrier substrate CR1 is removed before a touch electrode TE1 is disposed on the first flexible substrate 110. In another embodiment, the first carrier substrate CR1 is removed before a planarized layer PL is disposed on the first flexible substrate 110. In some embodiments, the touch electrode TE1 is disposed between the first flexible substrate 110 and the second flexible substrate 120.

In Step S130, the planarized layer PL is formed on the first flexible substrate 110. A method of forming the planarized layer PL is, for example, a coating process or a bonding process. In some embodiments, a material of the planarized layer PL may include an adhesive flowable material; that is, the planarized layer PL may be used as an adhesive layer. In the previous step, the process of separating the first carrier substrate CR1 from the first flexible substrate 110 may cause the surface of the first flexible substrate 110 to be uneven. Based on this, the arrangement of the planarized layer PL may be configured to fill a groove formed in the first flexible substrate 110 after the first flexible substrate 110 is separated from the first carrier substrate CR1 or to fill an original concave-convex structure on the surface of the first flexible substrate 110. In addition, the planarized layer PL may also be adhered to the film layer subsequently formed thereon, so that the film layer subsequently formed on the planarized layer PL may have better stability or adhesion. In the present embodiment, a material of the planarized layer PL may include an inorganic material, an organic material, or a combination of the inorganic material and the organic material, but the disclosure is not limited thereto. For example, the inorganic material may include, for example, silicon oxide, silicon nitride, silicon oxynitride or a combination of at least two of the above materials, and the organic material may include, for example, PI resin or acrylic resin, or may be optical transparent resin. The optical transparent resin may be, for example, acrylic resin, silicone resin or epoxy resin. The planarized layer PL may be of a single-layer structure, but the disclosure is not limited thereto. In other embodiments, the planarized layer PL may also be of a multilayer structure. In some embodiments, a total thickness of the first flexible substrate 110 and the planarized layer PL is greater than or equal to 0.3 micrometers (μm) and less than or equal to 300 μm. For example, the first flexible substrate 110 may have, for example, a thickness of 10 μm to 20 μm (10 μm≤thickness≤20 μm), and the planarized layer PL may have, for example, a thickness of 0.5 μm to 200 μm (0.5 μm≤thickness≤200 μm); that is, the thickness of the first flexible substrate 110 may be greater than or equal to the thickness of the planarized layer PL or the thickness of the first flexible substrate 110 may be less than the thickness of the planarized layer PL. From another point of view, a thickness ratio of the thickness of the planarized layer PL to the thickness of the first flexible substrate 110 is, for example, in a range from 0.025 to 20 (0.025≤thickness ratio≤20). In some embodiments, the thickness of the first flexible substrate 110 is defined as the maximum thickness of any cross section in a normal direction of the first flexible substrate 110, and the thickness of the planarized layer PL is defined as the maximum thickness of any cross section in the normal direction of the planarized layer PL. In another embodiment, a thickness ratio of the thickness of the planarized layer PL to the thickness of the first flexible substrate 110 is, for example, in a range from 0.25 to 20 (0.25≤thickness ratio≤20).

In Step S140, a third flexible substrate 150 provided with the touch electrode TE1 is provided, and the touch electrode TE1 and the planarized layer PL are bonded. In the present embodiment, the third flexible substrate 150 is supported by a third carrier substrate CR3, and the planarized layer PL may be used as the adhesive layer to bond the third flexible substrate 150 and the touch electrode TE1 disposed thereon to the planarized layer PL. The planarized layer PL is, for example, located between the touch electrode TE1 and the first flexible substrate 110. The touch electrode TE1 is, for example, formed on a surface, away from the second flexible substrate 120, of the first flexible substrate 110. In other words, the light conversion structure CF and the touch electrode TE1 are disposed on different sides of the first flexible substrate 110, but the disclosure is not limited thereto. In some other embodiments, the light conversion structure CF and the touch electrode TE1 are disposed on a same side of the first flexible substrate 110. The touch electrode TE1 and the planarized layer PL may be bonded to each other by, for example, an optical adhesive (not shown), and the disclosure is not particularly limited. The third flexible substrate 150 may have, for example, a material that is the same as or similar to the first flexible substrate 110 and the second flexible substrate 120, and the third carrier substrate CR3 may also have, for example, a material that is the same as or similar to the first carrier substrate CR1 and the second carrier substrate CR2. Based on this, the materials of the third flexible substrate 150 and the third carrier substrate CR3 and characteristics thereof may refer to the foregoing embodiments, and descriptions thereof are omitted herein. A method of forming the touch electrode TE1 may be, for example, a sputtering method, but the disclosure is not limited thereto. A material of the touch electrode TE1 may be similar to the material of the touch electrode TE2, and the description thereof is omitted. In the present embodiment, the touch electrode TE1 is a transparent conductive material layer. Through the arrangement of the planarized layer PL, the touch electrode TE1 may be arranged steadily without an uneven surface. Therefore, the touch electrode TE1 may have a stable electrical property.

In Step S150, the third carrier substrate CR3 and the third flexible substrate 150 are separated to remove the third carrier substrate CR3. A method of separating the third carrier substrate CR3 from the third flexible substrate 150 may be achieved, for example, by performing a laser stripping process or a mechanical stripping process. In the present embodiment, the laser stripping process is performed to separate the third carrier substrate CR3 from the third flexible substrate 150, but the disclosure is not limited thereto.

In Step S160, a first polarizer 160 is formed on the third flexible substrate 150. The first polarizer 160 is, for example, disposed on a surface, away from the first flexible substrate 110, of the third flexible substrate 150. In detail, the first polarizer 160 and the touch electrode TE1 are, for example, disposed on opposite sides of the third flexible substrate 150. The first polarizer 160 may be, for example, formed by a coating process. For example, the first polarizer 160 may be formed by coating a base material (not shown) with polyvinyl alcohol resin, and the disclosure is not limited thereto. In some other embodiments, the first polarizer 160 may be, for example, a wire grid polarizer. For example, the first polarizer 160 includes a plurality of wire grids formed on the base material. The plurality of wire grids is staggered on the base material and periodically arranged. A protective cover plate, an optical functional layer, or a combination of the protective cover plate and the optical functional layer may be subsequently disposed on the first polarizer 160, and the disclosure is not limited thereto.

In Step S170, the second carrier substrate CR2 and the second flexible substrate 120 are separated to remove the second carrier substrate CR2. A method of separating the second carrier substrate CR2 from the second flexible substrate 120 may be performed, for example, by performing a laser stripping process or a mechanical stripping process. In the present embodiment, the laser stripping process is performed to separate the second carrier substrate CR2 from the second flexible substrate 120, but the disclosure is not limited thereto. In the present embodiment, the first polarizer 160 may have been disposed on the third flexible substrate 150 before the second carrier substrate CR2 is separated from the second flexible substrate 120. Since the first polarizer 160 may provide supportability relative to the third flexible substrate 150, after the second carrier substrate CR2 is separated, excessive damage to the second flexible substrate 120 may be reduced, thus the indirect influence on the optical characteristics of the flexible display device of the present embodiment is decreased. In some embodiments, the second carrier substrate CR2 is selectively not removed.

In Step S180, a second polarizer 170 is formed on the second flexible substrate 120. The second polarizer 170 is, for example, disposed on a surface, away from the first flexible substrate 110, of the second flexible substrate 120. In detail, the second polarizer 170 and the touch electrode TE2 are, for example, disposed on opposite sides of the second flexible substrate 120. The second polarizer 170 may have, for example, a material that is the same as or similar to the first polarizer 160. Based on this, the material of the second polarizer 170 and characteristics thereof may refer to the foregoing embodiment, and descriptions thereof are omitted herein.

In Step S190, a flexible circuit board 180 is bonded on the second flexible substrate 120. In the present embodiment, the flexible circuit board 180 is electrically connected to the touch electrode TE1 and the touch electrode TE2. In the present embodiment, a driver chip 182 is disposed on the flexible circuit board 180, or the flexible circuit board 180 is electrically connected with the driver chip 182. For example, the driver chip 182 is disposed on the second flexible substrate 120 in a chip on plastic (COP) configuration, or the driver chip 182 is disposed on a printed circuit board (PCB), or other suitable carriers, but it is not limited thereto. In detail, the flexible circuit board 180 is, for example, configured to electrically connect the driver chip 182 to the touch electrode TE1 and/or the touch electrode TE2 to drive the touch electrode TE1 and/or the touch electrode TE2. The touch electrode TE1 of the present embodiment may be electrically connected to the touch electrode TE2 via a through hole H1 running through the planarized layer PL, the first flexible substrate 110 and/or the sealant 130. Based on this, the driver chip 182 disposed on the flexible circuit board 180 may be electrically connected to the touch electrode TE1 and/or the touch electrode TE2 through a route (not shown). In some embodiments, Step S190 may be completed before Step S170, but is not limited thereto.

At this point, the manufacturing of a flexible display device 100a of the disclosure is generated.

The manufacturing method of the flexible display device 100a of the present embodiment is described by exemplifying the above method, but the method of forming the flexible display device 100a of the disclosure is not limited thereto.

Figure 3:
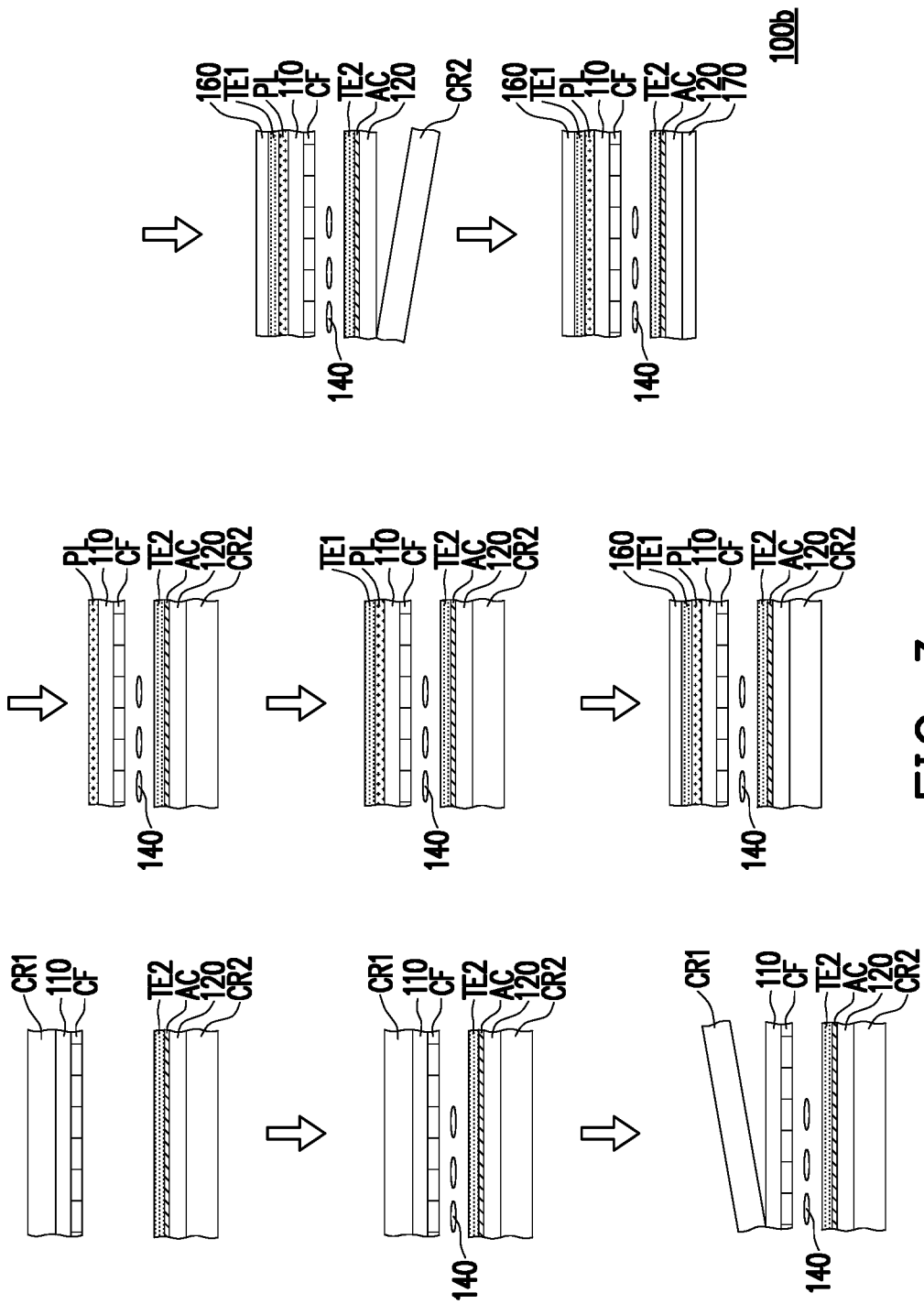
FIG. 3 is a schematic diagram of a partial manufacturing process of a flexible display device according to another embodiment of the disclosure.
Figure 4:
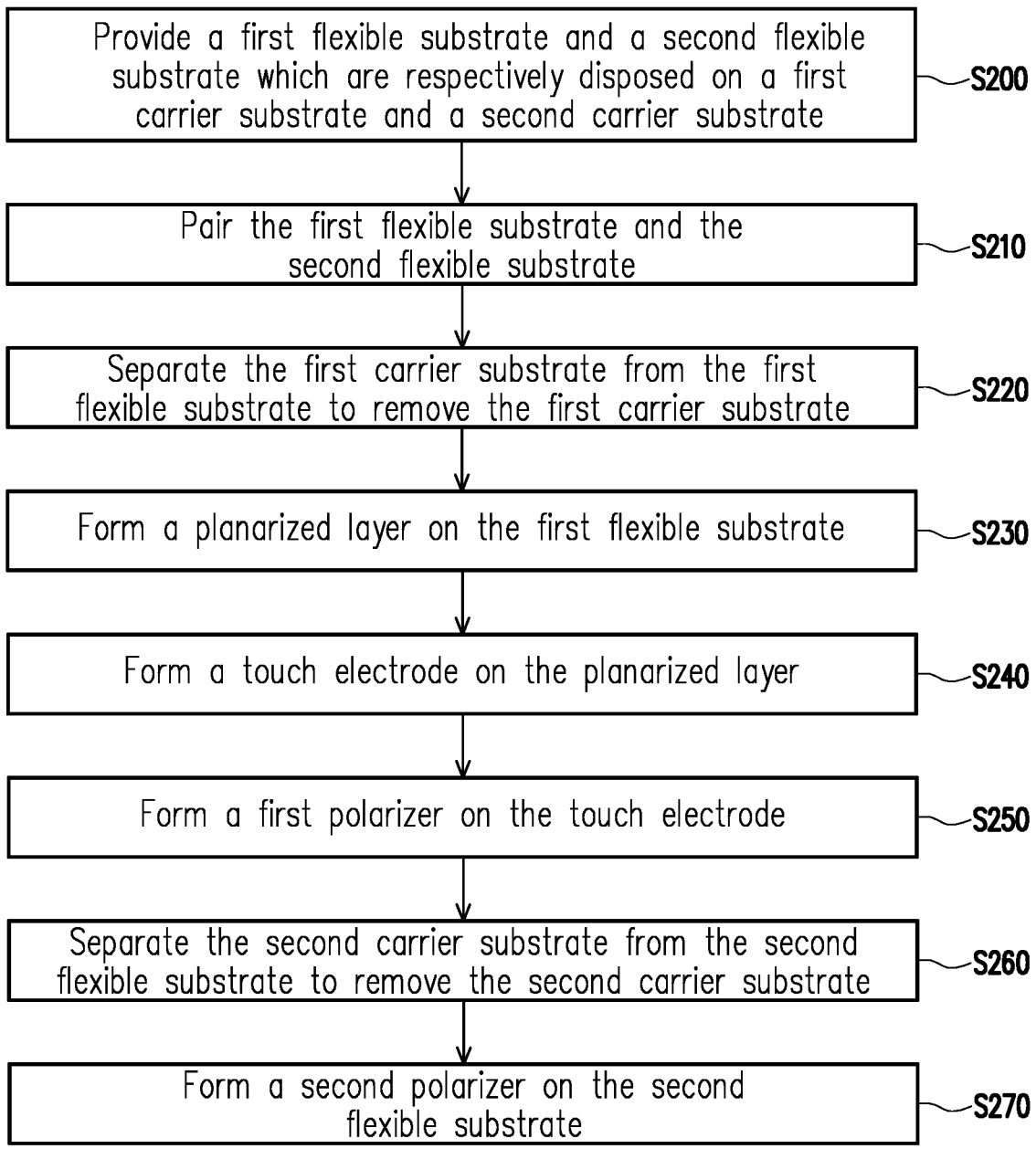
FIG. 4 is a flowchart of a manufacturing method of a flexible display device according to another embodiment of the disclosure.

FIG. 3 is a schematic diagram of a partial manufacturing process of a flexible display device according to another embodiment of the disclosure, and FIG. 4 is a flowchart of a manufacturing method of a flexible display device according to another embodiment of the disclosure. The embodiment of FIG. 3 uses the element reference numerals and partial contents of the embodiment of FIG. 1. The same or similar reference numerals are used to express the same or similar elements, and the description of the same technical content is omitted. The descriptions of the omitted portions may refer to the descriptions and effects of the foregoing embodiments, and will be no longer repeated in the following embodiments, and at least one portion of the non-omitted description of the embodiment of FIG. 3 may refer to the following content.

Referring to FIG. 3 and FIG. 4 at the same time, Step S200, Step S210 and Step S220 of the present embodiment are similar to Step S100, Step S110 and Step S120 of the aforementioned embodiment, and descriptions thereof are omitted herein.

In Step S230, a planarized layer PL is formed on the first flexible substrate 110. A method of forming the planarized layer PL is, for example, a coating process. In some embodiments, a material of the planarized layer PL may include an adhesive flowable material; that is, the planarized layer PL may be used as an adhesive layer. The planarized layer PL may be configured to fill a groove formed in the first flexible substrate 110 after the first flexible substrate 110 is separated from the first carrier substrate CR1, or may be adhered to a film layer subsequently formed on the planarized layer PL, so that the film layer subsequently formed on the planarized layer PL may have good stability. In the present embodiment, a material of the planarized layer PL may include an inorganic material, an organic material, or a combination of the inorganic material and the organic material, but the disclosure is not limited thereto. For example, the inorganic material may include, for example, silicon oxide, silicon nitride, silicon oxynitride or a combination of at least two of the above materials, and the organic material may include, for example, PI resin or acrylic resin. The planarized layer PL may be of a single-layer structure, but the disclosure is not limited thereto. In other embodiments, the planarized layer PL may also be of a multilayer structure. In some embodiments, a total thickness of the first flexible substrate 110 and the planarized layer PL is greater than or equal to 0.3 μm and less than or equal to 300 μm. For example, the first flexible substrate 110 may have, for example, a thickness of 10 μm to 20 μm (10 μm≤thickness≤20 μm), and the planarized layer PL may have, for example, a thickness of 0.5 μm to 5 μm (0.5 μm≤thickness≤5 μm). From another point of view, a thickness ratio of the thickness of the planarized layer PL to the thickness of the first flexible substrate 110 is, for example, in a range from 0.025 to 2 (0.025≤thickness ratio≤2), but the disclosure is not limited thereto.

In Step S240, a touch electrode TE1 is formed on the planarized layer PL. The touch electrode TE1 is, for example, formed on the planarized layer PL by a coating process. A material of the touch electrode TE1 and characteristics thereof may refer to the foregoing embodiment, and descriptions thereof are omitted herein.

In Step S250, a first polarizer 160 is formed on the touch electrode TE1. The first polarizer 160 is disposed, for example, on a surface, away from the second flexible substrate 120, of the first flexible substrate 110. A method of forming the first polarizer 160 on the touch electrode TE1 may refer to the foregoing embodiment, and descriptions thereof are omitted herein.

In Step S260, the second carrier substrate CR2 and the second flexible substrate 120 are separated to remove the second carrier substrate CR2. A method of separating the second carrier substrate CR2 from the second flexible substrate 120 may refer to the foregoing embodiment, and descriptions thereof are omitted herein. In some embodiments, the second carrier substrate CR2 is selectively not removed.

In Step S270, a second polarizer 170 is formed on the second flexible substrate 120. The second polarizer 170 is, for example, disposed on a surface, away from the first flexible substrate 110, of the second flexible substrate 120. In detail, the second polarizer 170 and the touch electrode TE2 are, for example, disposed on opposite sides of the second flexible substrate 120. A method of forming the second polarizer 170 on the second flexible substrate 120 may refer to the foregoing embodiment, and descriptions thereof are omitted herein.

Then, a flexible circuit board and a driver chip which are configured to drive the touch electrode TE1 and the touch electrode TE2 may be disposed. A method of disposing the flexible circuit board and the driver chip may refer to the foregoing embodiment, and descriptions thereof are omitted herein.

At this point, the manufacturing of a flexible display device 100b of the disclosure is completed.

The manufacturing method of the flexible display device 100b of the present embodiment is described by exemplifying the above method, but the method of forming the flexible display device 100b of the disclosure is not limited thereto.

Figure 5:
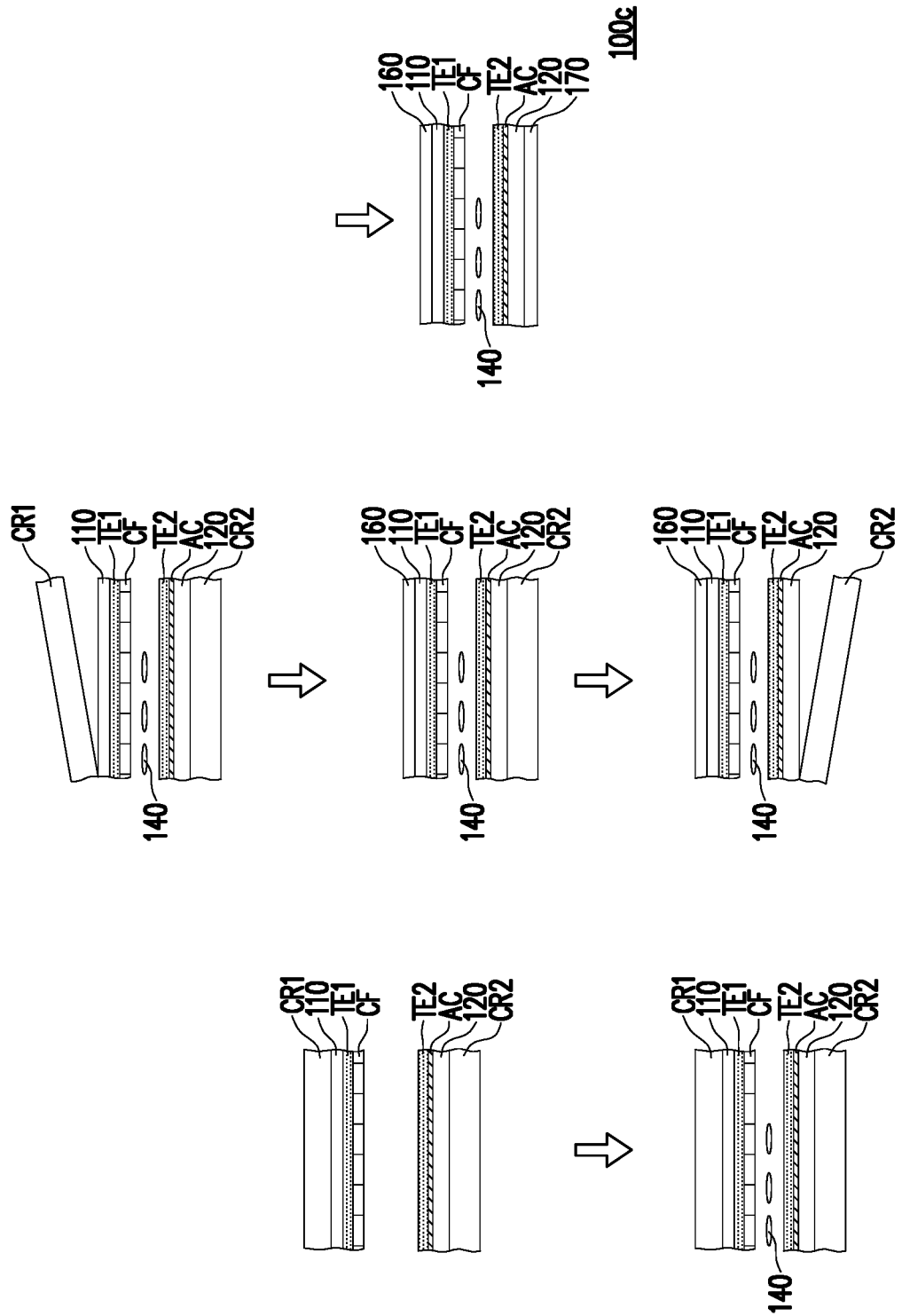
FIG. 5 is a schematic diagram of a partial manufacturing process of a flexible display device according to a further embodiment of the disclosure.
Figure 6:
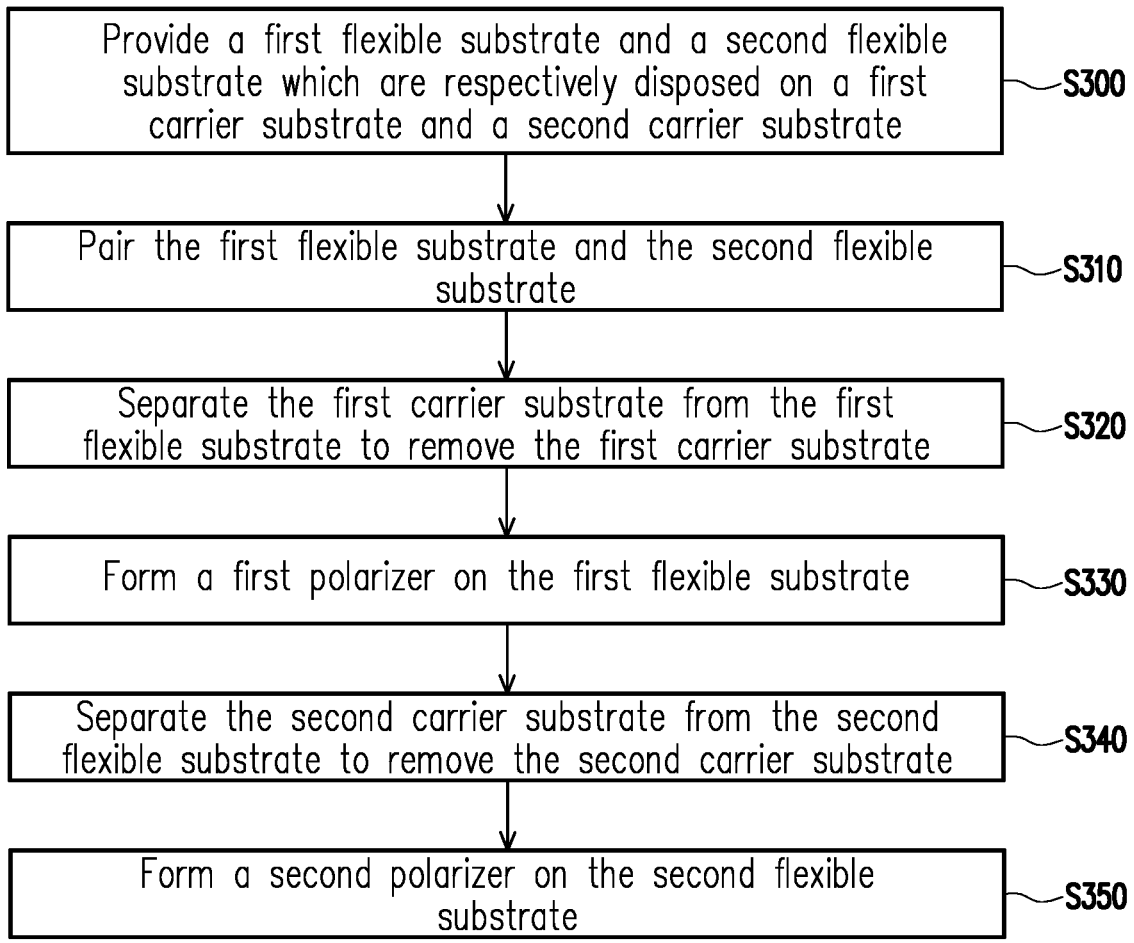
FIG. 6 is a flowchart of a manufacturing method of a flexible display device according to a further embodiment of the disclosure.

FIG. 5 is a schematic diagram of a partial manufacturing process of a flexible display device according to a further embodiment of the disclosure, and FIG. 6 is a flowchart of a manufacturing method of a flexible display device according to a further embodiment of the disclosure. The embodiment of FIG. 5 uses the element reference numerals and partial contents of the embodiment of FIG. 1. The same or similar reference numerals are used to express the same or similar elements, and the description of the same technical content is omitted. The descriptions of the omitted portions may refer to the descriptions and effects of the foregoing embodiments, and will be no longer repeated in the following embodiment, and at least one portion of the non-omitted description of the embodiment of FIG. 5 may refer to the following content.

Referring to FIG. 5 and FIG. 6 at the same time, in Step S300 of the present embodiment, a first flexible substrate 110 and a second flexible substrate 120 which are respectively disposed on a first carrier substrate CR1 and a second carrier substrate CR2 are provided. In the present embodiment, a touch electrode TE1 and a light conversion structure CF are disposed on the first flexible substrate 110 in sequence, and a touch electrode TE2 is disposed on the second flexible substrate 120. In detail, the touch electrode TE1 and the light conversion structure CF are, for example, formed on a surface, facing the second flexible substrate 120, of the first flexible substrate 110; that is, the light conversion structure CF and the touch electrode TE1 are disposed on the same side of the first flexible substrate 110.

Furthermore, the touch electrode TE1 of the present embodiment is disposed between the first flexible substrate 110 and the light conversion structure CF, but the disclosure is not limited thereto. In another embodiment, the light conversion structure CF is disposed between the first flexible substrate 110 and the touch electrode TE1. The touch electrode TE2 is, for example, disposed on a surface, facing the first flexible substrate 110, of the second flexible substrate 120. Materials of the first carrier substrate CR1, the second carrier substrate CR2, the first flexible substrate 110, the second flexible substrate 120, the light conversion structure CF, the touch electrode TE1 and the touch electrode TE2 and characteristics thereof may refer to the foregoing embodiment, and descriptions thereof are omitted herein.

In Step S310, the first flexible substrate 110 and the second flexible substrate 120 are paired. A method of pairing the first flexible substrate 110 and the second flexible substrate 120 may refer to the foregoing embodiment, and descriptions thereof are omitted herein.

In Step S320, the first carrier substrate CR1 and the first flexible substrate 110 are separated to remove the first carrier substrate CR1. A method of separating the first carrier substrate CR1 from the first flexible substrate 110 may refer to the foregoing embodiment, and descriptions thereof are omitted herein.

In Step S330, a first polarizer 160 is formed on the first flexible substrate 110. The first polarizer 160 is disposed, for example, on a surface, away from the second flexible substrate 120, of the first flexible substrate 110. A method of forming the second polarizer 160 on the first flexible substrate 110 may refer to the foregoing embodiment, and descriptions thereof are omitted herein.

In Step S340, the second carrier substrate CR2 and the second flexible substrate 120 are separated to remove the second carrier substrate CR2. A method of separating the second carrier substrate CR2 from the second flexible substrate 120 may refer to the foregoing embodiment, and descriptions thereof are omitted herein. In some embodiments, the second carrier substrate CR2 is selectively not removed.

In Step S350, a second polarizer 170 is formed on the second flexible substrate 120. The second polarizer 170 is, for example, disposed on a surface, away from the first flexible substrate 110, of the second flexible substrate 120. In detail, the second polarizer 170 and the touch electrode TE2 are, for example, disposed on opposite sides of the second flexible substrate 120. A method of forming the second polarizer 170 on the second flexible substrate 120 may refer to the foregoing embodiment, and descriptions thereof are omitted herein.

Then, a flexible circuit board and a driver chip which are configured to drive the touch electrode TE1 and the touch electrode TE2 may be disposed. A method of disposing the flexible circuit board and the driver chip may refer to the foregoing embodiment, and descriptions thereof are omitted herein.

At this point, the manufacturing of a flexible display device 100c of the disclosure is completed.

The manufacturing method of the flexible display device 100c of the present embodiment is described by exemplifying the above method, but the method of forming the flexible display device 100c of the disclosure is not limited thereto.

Figure 7A:
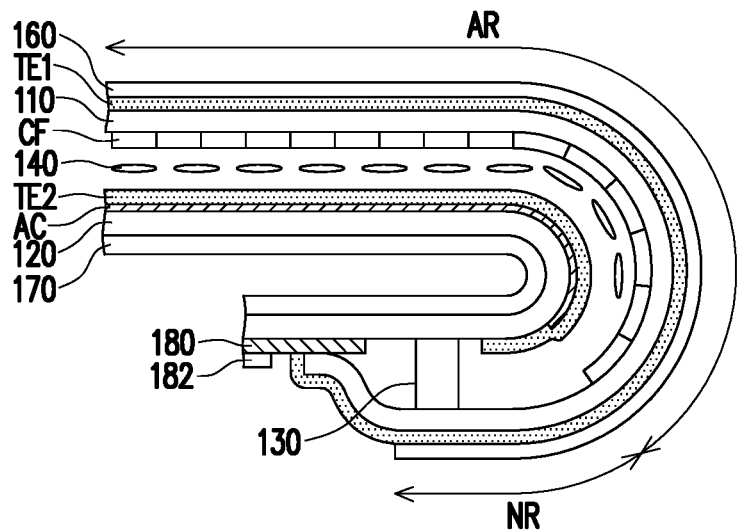
FIG. 7A is a schematic partial cross-sectional diagram of a flexible display device according to an embodiment of the disclosure.
Figure 7B:
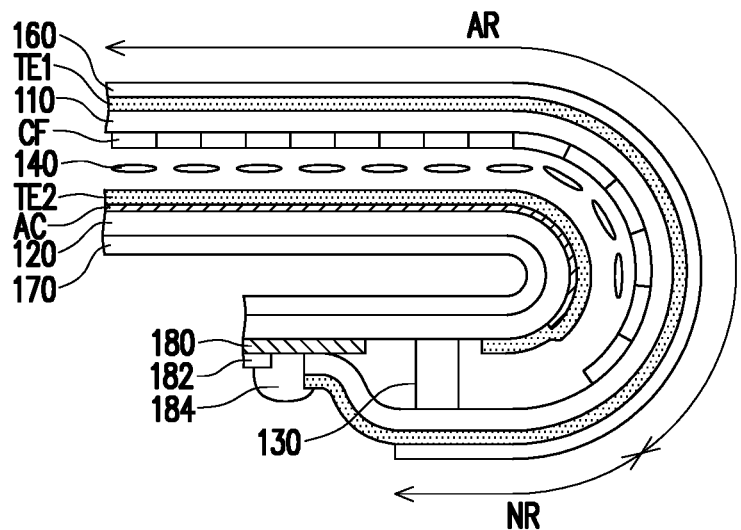
FIG. 7B is a schematic partial cross-sectional diagram of a flexible display device according to another embodiment of the disclosure.
Figure 7C:
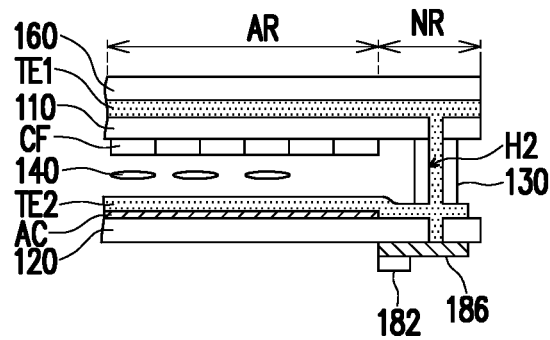
FIG. 7C is a schematic partial cross-sectional diagram of a flexible display device according to a further embodiment of the disclosure.

FIG. 7A is a schematic partial cross-sectional diagram of a flexible display device according to an embodiment of the disclosure, FIG. 7B is a schematic partial cross-sectional diagram of a flexible display device according to another embodiment of the disclosure, and FIG. 7C is a schematic partial cross-sectional diagram of a flexible display device according to a further embodiment of the disclosure. The embodiments of FIG. 7A to FIG. 7C use the element reference numerals and partial contents of the embodiment of FIG. 1. The same or similar reference numerals are used to express the same or similar elements, and the description of the same technical content is omitted. The descriptions of the omitted portions may refer to the descriptions and effects of the foregoing embodiments, and will be no longer repeated in the following embodiment, and a bonding and setting mode of a flexible circuit board 180, disclosed in the embodiments of FIG. 7A to FIG. 7C, may also be applied to the flexible display device 100b or the flexible display device 100c. In addition, the bonding and setting mode of the flexible circuit board 180 in FIG. 1 may also be applied to the flexible display device 100b or the flexible display device 100c.

Referring to FIG. 7A, one mode of electrically connecting the driver chip 182 in the flexible display device of the present embodiment to the touch electrode TE1 and the touch electrode TE2 is illustrated. As shown in FIG. 7A, the first flexible substrate 110 in a non-display region NR may bend to be in contact with the flexible circuit board 180 disposed on the second flexible substrate 120. Based on this, the touch electrode TE1 disposed on the outer surface of the first flexible substrate 110 may be thus electrically connected to the driver chip 182 disposed on the flexible circuit board 180. In addition, the touch electrode TE2 disposed on the inner surface of the second flexible substrate 120 may be electrically connected, through a route (not shown), to the driver chip 182 disposed on the flexible circuit board 180.

Referring to FIG. 7B, another mode of electrically connecting the driver chip 182 in the flexible display device of the present embodiment to the touch electrode TE1 and the touch electrode TE2 is illustrated. As shown in FIG. 7B, the flexible display device of the present embodiment further includes a conductive adhesive 184 located in the non-display region NR and covering part of the touch electrode TE1 and the flexible circuit board 180. The conductive adhesive 184 may include, for example, any highly-conductive material, and the disclosure has no limitation to this. The first flexible substrate 110 in the non-display region NR may bend to be in contact with the flexible circuit board 180 disposed on the second flexible substrate 120. Based on this, the touch electrode TE1 disposed on the outer surface of the first flexible substrate 110 may be electrically connected, through the conductive adhesive 184, to the driver chip 182 disposed on the flexible circuit board 180. In addition, the touch electrode TE2 disposed on the inner surface of the second flexible substrate 120 may be electrically connected, through a route (not shown), to the driver chip 182 disposed on the flexible circuit board 180.

Referring to FIG. 7C, a further mode of electrically connecting the driver chip 182 in the flexible display device of the present embodiment to the touch electrode TE1 and the touch electrode TE2 is illustrated. As shown in FIG. 7C, the flexible display device of the present embodiment does not include the flexible circuit board 180, but includes a contact pad 186. The contact pad 186 is disposed on the outer surface of the second flexible substrate 120, and, for example, corresponds to the sealant 130. In addition, the driver chip 182 is disposed on the contact pad 186. The touch electrode TE1 of the present embodiment may be electrically connected to the touch electrode TE2 and the contact pad 186 via a through hole H2 running through the first flexible substrate 110, the sealant 130, and/or the second flexible substrate 120. Based on this, the driver chip 182 disposed on the contact pad 186 may be electrically connected to the touch electrode TE1 and/or the touch electrode TE2.

Of course, the flexible display device of the embodiments of the disclosure is not limited to the above connecting modes. For example, two mutually electrically connected flexible circuit boards may also be electrically connected to the touch electrode TE1 and the touch electrode TE2, respectively.

Figure 8:
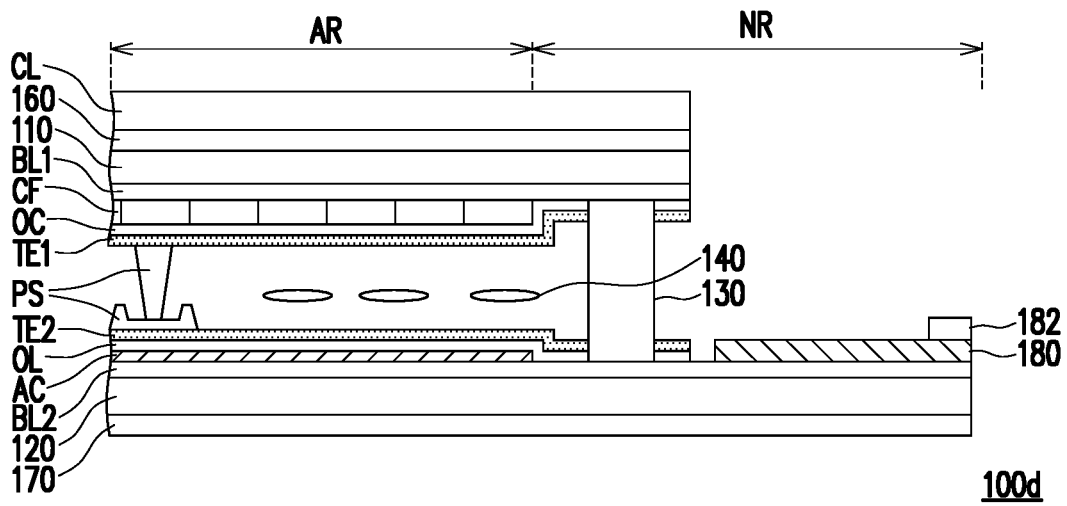
FIG. 8 is a schematic partial cross-sectional diagram of a flexible display device according to a still further embodiment of the disclosure.

FIG. 8 is a schematic partial cross-sectional diagram of a flexible display device according to a still further embodiment of the disclosure. The embodiment of FIG. 8 uses the element reference numerals and partial contents of the embodiment of FIG. 1. The same or similar reference numerals are used to express the same or similar elements, and the description of the same technical content is omitted. The descriptions of the omitted portions may refer to the descriptions and effects of the foregoing embodiments, and will be no longer repeated in the following embodiment, and at least one portion of the non-omitted description of the embodiment of FIG. 8 may refer to the following content.

Referring to FIG. 8, a flexible display device 100d of the present embodiment includes a first flexible substrate 110, a second flexible substrate 120, a sealant 130, a display medium layer 140, a first polarizer 160, a second polarizer 170, a flexible circuit board 180, a driver chip 182, an element layer AC, a light conversion structure CF, a touch electrode TE1 and a touch electrode TE2.

The first flexible substrate 110 is, for example, opposite to the second flexible substrate 120, and a surface, facing the second flexible substrate 120, of the first flexible substrate 110 supports the light conversion structure CF and the touch electrode TE1 in sequence. In other words, the light conversion structure CF and the touch electrode TE1 are disposed on the same side of the first flexible substrate 110, and the light conversion structure CF is located between the touch electrode TE1 and the first flexible substrate 110. In addition, a surface, facing the first flexible substrate 110, of the second flexible substrate 120 supports the element layer AC and the touch electrode TE2 in sequence. The sealant 130 is, for example, disposed between the first flexible substrate 110 and the second flexible substrate 120, and is located in a non-display region NR of the flexible display device 100d. The display medium layer 140 is, for example, disposed between the first flexible substrate 110 and the second flexible substrate 120, and is located in a display region AR of the flexible display device 100d, and the display medium layer 140 is surrounded by the sealant 130. The first polarizer 160 is, for example, disposed on a surface, away from the second flexible substrate 120, of the first flexible substrate 110, and the second polarizer 170 is, for example, disposed on a surface, away from the first flexible substrate 110, of the second flexible substrate 120. The flexible circuit board 180 is, for example, disposed on the second flexible substrate 120, and is, for example, provided with the driver chip 182. The driver chip 182 may be configured to drive the touch electrode TE1 and the touch electrode TE2 through routes (not shown) connecting the flexible circuit board 180, the touch electrode TE1 and the touch electrode TE2.

In addition, the flexible display device 100d of the present embodiment further includes a buffer layer BL1, a buffer layer BL2, a protective cover plate CL, an insulating layer OL, a protective layer OC and a spacer PS.

The buffer layer BL1 is, for example, disposed between the light conversion structure CF and the first flexible substrate 110, and the buffer layer BL2 is, for example, disposed between the element layer AC and the second flexible substrate 120, which may reduce damage to the light conversion structure CF and the element layer AC when the light conversion structure CF and the element layer AC are formed on the first flexible substrate 110 and the second flexible substrate 120, respectively. The protective cover plate CL is, for example, disposed on a surface, away from the first flexible substrate 110, of the first polarizer 160, which may reduce damage of an external environment to members inside the flexible display device 100d. The insulating layer OL covers, for example, the element layer AC, which may provide a relatively flat surface to stably form the touch electrode TE2. The protective layer OC covers, for example, the light conversion structure CF, which may reduce damage to the light conversion structure CF caused by the contact with other members. The spacer PS is, for example, disposed between the first flexible substrate 110 and the second flexible substrate 120 to support the first flexible substrate 110 and the second flexible substrate 120, so as to provide a space for filling of the display medium layer 140.

Figure 9:
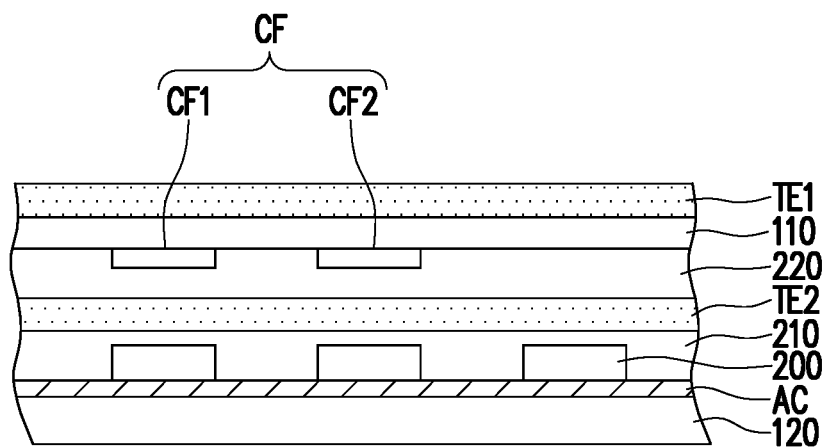
FIG. 9 is a schematic partial cross-sectional diagram of a flexible display device according to a still further embodiment of the disclosure.

FIG. 9 is a schematic partial cross-sectional diagram of a flexible display device according to a still further embodiment of the disclosure. The embodiment of FIG. 9 uses the element reference numerals and partial contents of the embodiment of FIG. 1. The same or similar reference numerals are used to express the same or similar elements, and the description of the same technical content is omitted. The descriptions of the omitted portions may refer to the descriptions and effects of the foregoing embodiments, and will be no longer repeated in the following embodiment, and at least one portion of the non-omitted description of the embodiment of FIG. 9 may refer to the following content.

Referring to FIG. 9, a main difference between a display device 100e of the present embodiment and the display device 100a of the foregoing embodiment is that: the display device 100e of the present embodiment does not have an entire continuous display medium layer 140, but takes a plurality of LEDs 200 as display elements. The plurality of LED elements 200 are, for example, disposed between the touch electrode TE2 and the element layer AC, and may be, for example, arranged on the second flexible substrate 120 in an array. In the present embodiment, the plurality of LED elements 200 are flip chip type LED elements that may be electrically connected to the element layer AC through bumps (not shown), but the disclosure is not limited thereto. The plurality of LED elements 200 are, for example, LEDs that are capable of emitting blue light, but are not limited thereto. For example, a material of the plurality of LED elements 200 includes a p-type semiconductor layer and an n-type semiconductor layer, and a material of the semiconductor layer may include gallium nitride, but the disclosure is not limited thereto. In addition, the plurality of LED elements 200 may be, for example, LED crystal grains having a size in a micron grade. For example, the plurality of LED elements 200 may be, for example, micro LEDs or mini LEDs. In addition, the LED elements 200 of the present embodiment are LEDs capable of emitting the blue light, and the light conversion structure CF of the present embodiment may include, for example, a light conversion pattern CF1 and a light conversion pattern CF2 which may respectively convert the blue light into red light and green light in the three primary colors, but the disclosure is not limited thereto. In the present embodiment, a filling layer 210 is also disposed on the second flexible substrate 120. The filling layer 210 is disposed among the plurality of LED elements 200 and located around the LED elements 200, and may be configured to fix the LED elements 200. The height of the filling layer 210 may be greater than, equal to, or less than the heights of the LED elements 200. FIG. 9 discloses that the height of the filling layer 210 is greater than the heights of the LED elements 200, but this is only a specific implementation for illustrating the disclosure, and does not limit the scope of the disclosure in any way. In some embodiments, a material of the filling layer 210 may include epoxy resin-based filler, acrylic-based filler, other polymer filler, or a combination thereof. In addition, an optical sealant 220 may be further disposed between the first flexible substrate 110 and the second flexible substrate 120 to bond the first flexible substrate 110 and the second flexible substrate 120, but the disclosure is not limited thereto.

Based on the above, according to the flexible display device of the embodiments of the disclosure, through disposing the light conversion structure and the touch electrodes on the same flexible substrate, the thickness of the flexible display device may be effectively reduced. The touch electrodes are closer to a user, so that the flexible display device may have high sensitivity. In addition, the manufacturing method of the flexible display device of the embodiments of the disclosure is simple or has low manufacturing cost.

It should be finally noted that the above embodiments are merely intended for describing the technical solutions of the disclosure rather than limiting the disclosure. Although the disclosure is described in detail with reference to the foregoing embodiments, persons of ordinary skill in the art should understand that they can still make modifications to the technical solutions described in the foregoing embodiments or make equivalent substitutions to some technical features thereof, without departing from scope of the technical solutions of the embodiments of the disclosure. The features of the embodiments may be used in any combination without departing from the spirit of the disclosure or conflicting with each other.

What is claimed is:

1. A flexible device, comprising:
   a flexible substrate;
   a planarized layer, disposed on the flexible substrate and configured to planarize the flexible substrate;
   a touch electrode disposed on the planarized layer; and
   a light conversion structure disposed on the flexible substrate,
   wherein a thickness of the planarized layer is in a range from 0.5 μm to 200 μm, and
   wherein a thickness ratio of the thickness of the planarized layer to a thickness of the flexible substrate is in a range from 0.025 to 20.

2. The flexible device according to claim 1, further comprising an element layer disposed between the flexible substrate and the touch electrode.

3. The flexible device according to claim 2, further comprising an insulating layer disposed between the touch electrode and the element layer.

4. The flexible device according to claim 1, further comprising a polarizer disposed on the flexible substrate.

5. The flexible device according to claim 4, further comprising a protective cover plate disposed on the polarizer.

6. The flexible device according to claim 1, further comprising a medium layer disposed on the flexible substrate.

7. The flexible device according to claim 6, wherein the medium layer comprises an organic light emitting diode.

\* \* \* \* \*